US008686402B2

(12) United States Patent
Goel et al.

(10) Patent No.: US 8,686,402 B2
(45) Date of Patent: Apr. 1, 2014

(54) TUNNEL FIELD EFFECT TRANSISTOR AND METHOD OF MANUFACTURING SAME

(76) Inventors: Niti Goel, Austin, TX (US); William Tsai, Saratoga, CA (US); Jack Kavalieros, Portland, OR (US)

(*) Notice: Subject to any disclaimer, the term of this patent is extended or adjusted under 35 U.S.C. 154(b) by 19 days.

(21) Appl. No.: 13/224,661

(22) Filed: Sep. 2, 2011

(65) Prior Publication Data
US 2011/0315960 A1    Dec. 29, 2011

Related U.S. Application Data

(62) Division of application No. 12/319,102, filed on Dec. 30, 2008, now Pat. No. 8,026,509.

(51) Int. Cl.
*H01L 29/20* (2006.01)
*H01L 29/12* (2006.01)

(52) U.S. Cl.
USPC .. 257/24; 257/25; 257/E29.091; 257/E21.409

(58) Field of Classification Search
USPC ............ 257/24, 25, E29.091, E29.251, 257/E29.254, E29.255, E21.407, E21.403, 257/615, 76, E21.409
See application file for complete search history.

(56) References Cited

U.S. PATENT DOCUMENTS

| 4,675,711 A * | 6/1987 | Harder et al. | 257/27 |
| 8,148,718 B2 * | 4/2012 | Asbeck et al. | 257/27 |
| 2007/0178650 A1 | 8/2007 | Chen et al. | |

FOREIGN PATENT DOCUMENTS

| EP | 1900681 A1 | 3/2008 |
| EP | 1959481 A1 | 8/2008 |
| JP | 63-276277 A | 11/1988 |
| JP | 63-288061 A | 11/1988 |
| JP | 10-035508 B2 | 7/1989 |
| JP | 8-78700 A | 3/1996 |
| JP | 10-50730 A | 2/1998 |
| JP | 2005-294831 A | 10/2005 |
| JP | 2008-103702 A | 5/2008 |
| WO | 2008/072164 A1 | 6/2008 |
| WO | 2010/078054 A2 | 7/2010 |
| WO | 2010/078054 A3 | 10/2010 |

OTHER PUBLICATIONS

Office Action Received for Chinese Patent Application No. 200980153845.1 mailed on Nov. 27, 2012, 8 pages of Office Action and 8 pages of English Translation.
Bhuwalka et al. "Performance Enhancement of Vertical Tunnel Field-Effect Transistor with SiGe in the δp+ Layer", Japanese Journal of Apllied Physics, vol. 43, No. 7A, 2004, pp. 4073-4078.

(Continued)

*Primary Examiner* — Calvin Lee
*Assistant Examiner* — Scott Stowe
(74) *Attorney, Agent, or Firm* — Kenneth A. Nelson

(57) ABSTRACT

A TFET includes a source region (110, 210), a drain region (120, 220), a channel region (130, 230) between the source region and the drain region, and a gate region (140, 240) adjacent to the channel region. The source region contains a first compound semiconductor including a first Group III material and a first Group V material, and the channel region contains a second compound semiconductor including a second Group III material and a second Group V material. The drain region may contain a third compound semiconductor including a third Group III material and a third Group V material.

20 Claims, 5 Drawing Sheets

(56) References Cited

OTHER PUBLICATIONS

International Preliminary Report on Patentability received for PCT Patent Application No. PCT/US2009/068550, mailed on Jul. 14, 2011, 5 pages.

Office Action Received for Korean Patent Application No. 2011-7015170 mailed on Sep. 24, 2012, 5 pages of English Translation only.

Office Action Received for Taiwanese Patent Application No. 098144174 mailed on Februray 21, 2013, 8 pages of Office Action and 1 page of search report.

Office Action Received for Japanese Patent Application No. 2011-544473 mailed on Mar. 19, 2013, 4 pages of Office Action and 8 pages of English Translation.

* cited by examiner

US 8,686,402 B2

TUNNEL FIELD EFFECT TRANSISTOR AND METHOD OF MANUFACTURING SAME

CLAIM OF PRIORITY

This application is a divisional of U.S. patent application Ser. No. 12/319,102, now U.S. Pat. No. 8,026,509, which was filed on Dec. 30, 2008.

FIELD OF THE INVENTION

The disclosed embodiments of the invention relate generally to tunnel field effect transistors, and relate more particularly to materials that may be used in such transistors.

BACKGROUND OF THE INVENTION

The Tunnel Field Effect Transistor, or TFET, is a device being studied for its potential to overcome certain obstacles in transistor manufacture and operation that are likely to arise at deep sub-micron microprocessor technology nodes. Among other potential advantages, it is anticipated that TFETs will help enable scaling to, for example, 22 nanometers (nm) because the threshold voltage ($V_t$) of a TFET is not limited by the discrete nature of dopants in the channel region with scaling, and because sub-threshold swing S can be lower than 60 millivolts/decade (mV/dec). As a result, the off-state leakage current ($I_{off}$) can be significantly reduced below that of existing complementary metal-oxide semiconductors (CMOS) devices. TFETs also have high-speed switching capability.

The TFET structure is close to that of a CMOS transistor. There are two types of TFET: n-type (NTFETs) and p-type (PTFETs). The drain current increases with increasing gate voltage ($V_g$) for an NTFET and increases with decreasing $V_g$ for a PTFET. The NTFET switches on for gate-source voltage ($V_{gs}$) greater than $V_t$, while the PTFET switches on for $V_{gs}$ less than $V_t$. The source in an NTFET is p-doped while the drain is n-doped and the source in a PTFET is n-doped while the drain is p-doped. A TFET shows exponentially increasing and temperature-independent characteristics at both off and on states. Unlike conventional CMOS devices, where sub-threshold swing S has a lower limit of 60 mV/dec at 300K, S in TFETs is independent of temperature. As a result, as mentioned above, off-state leakage can be significantly reduced. The threshold voltage in a TFET is controlled by the width and the height at the source end of the tunneling junction and is independent of the channel doping. The energy band gap at the tunnel junction determines the tunnel barrier height. It has also been demonstrated that the introduction of what is referred to as a delta layer between source and channel regions lowers the valence band offset and band gap at the tunneling junction with respect to the source region material. This decreases the tunneling barrier height, thus leading to higher tunneling probability.

BRIEF DESCRIPTION OF THE DRAWINGS

The disclosed embodiments will be better understood from a reading of the following detailed description, taken in conjunction with the accompanying figures in the drawings in which.

Figure 1:
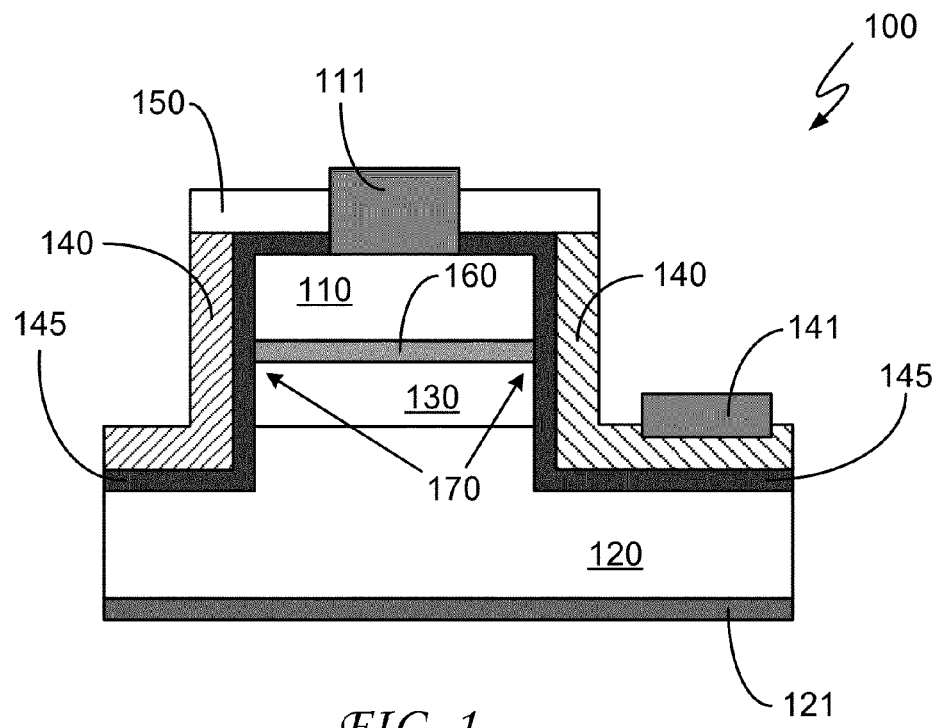
FIG. 1 is a cross-sectional view of a TFET according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a TFET comprises a source region, a drain region, a channel region between the source region and the drain region, and a gate region adjacent to the channel region. The source region contains a first compound semiconductor comprising a first Group III material and a first Group V material, and the channel region contains a second compound semiconductor comprising a second Group III material and a second Group V material.

Certain potential advantages of the TFET structure were mentioned above. These included a high-speed switching capability and the potential to overcome scaling limits of conventional CMOS transistors due, at least in part, to the temperature independence of sub-threshold swing S that enables a decrease in $I_{off}$ with device scaling. Existing TFETs, however, require high doping concentrations in source and drain regions in order to enhance tunneling current density, leading to the possible amorphization of source and drain regions. As will be explained in detail below, embodiments of the invention offer a viable TFET manufacturing process utilizing easily-implemented III-V-based materials that eliminate implantation-induced damages.

More specifically, embodiments of the invention exploit type-II band offsets, Fermi level pinning in the conduction band due to surface states, and crystalline re-growth characteristics of III-V semiconductors to fabricate a TFET. Characteristics of TFETs according to various embodiments of the invention may include a planar or vertical TFET with a III-V layer stack, a multi-layer stack as epitaxial component with type-II band alignments between adjacent layers, a drain (e.g., an n+ region) of material that typically pins in the conduction band, and in-situ doping of source and drain as opposed to high energy implantation.

Referring now to the drawings, FIG. 1 is a cross-sectional view of a TFET 100 according to an embodiment of the invention. As illustrated in FIG. 1, TFET 100 comprises a source region 110 and a drain region 120 formed on a substrate (not shown), a channel region 130 between source region 110 and drain region 120, and a gate region 140 adjacent to channel region 130. A gate insulator 145 electrically insulates gate region 140 and the source, channel, and drain regions from each other. In one embodiment, gate region 140 contains a metal gate electrode and gate insulator 145 is a high-k dielectric material. In another embodiment, gate region 140 contains a polysilicon gate electrode and gate insulator 145 is an oxide material.

A source contact 111 allows a voltage to be applied to source region 110, and similar contacts are associated with drain region 120 and gate region 140, namely, a drain contact 121 and a gate contact 141, respectively. A spacer 150 caps gate region 140 and gate insulator 145.

For increased doping levels at the source-channel interface, a delta layer may be introduced. In the illustrated embodiment, TFET 100 further comprises a delta layer 160 located between source region 110 and channel region 130. A portion of delta layer 160 is thus located at a tunneling junction 170 of TFET 100. Delta layer 160 comprises a material that lowers at least one of the valence band offset and the band gap at tunneling junction 170 (which, as shown, is located at the ends of channel region 130). As mentioned above, lower valence band offsets and lower band gaps decrease tunneling barrier height and increase tunneling probability. In a particular embodiment, delta layer 170 comprises $GaAs_{0.08}Sb_{0.92}$. In the same or another embodiment, delta layer 170 is grown fully strained, i.e., is grown such that it does not exceed the critical layer thickness.

Source region 110 contains a first compound semiconductor comprising a first Group III material and a first Group V material. Channel region 130 contains a second compound semiconductor comprising a second Group III material and a second Group V material. These materials may combine to create homojunctions, where source, channel and drain regions are of same material, or heterojunctions, where source, channel and drain regions are of at least two different materials.

According to one embodiment of the invention, the second compound semiconductor has type-II band alignment with the first compound semiconductor. As known in the art, this means that the band offsets are such that the valence band of the source region falls in the band gap of the channel region whereas the conduction band of the source region is higher than the conduction band of the channel region. The effective band gap of the channel region is thus further reduced, tunneling probability is improved, and the need to have high source doping is eliminated in favor of the somewhat lower concentrations of in-situ doping. In-situ doping during source material deposition can easily be implemented according to standard techniques. In the same or another embodiment, the first compound semiconductor and the second compound semiconductor are lattice matched to each other. Examples of materials exhibiting the foregoing characteristics are given below.

Since the band offsets are such that it is easier to move bands to align Fermi levels, considerably lower doping is needed, as mentioned above. The doping in the source/drain region could be as low as the $1 \times 10^{16}$ cm$^{-3}$ range. As also mentioned, this allows in-situ doping to be sufficient and eliminates the need to employ implantation with its possibility of amorphization of the source and drain regions.

In certain embodiments, drain region 120 (in an NTFET) contains a material having a charge neutrality level that lies above a bottom of its conduction band. This means that its Fermi level pinning position is in the conduction band, i.e., it is an intrinsic semiconductor. Introducing layers which pin in the conduction band can diminish or eliminate the need for high doping in the drain. In one embodiment, the material of drain region 120 comprises a third compound semiconductor such as InAs, InN, or the like. (The foregoing discussion also applies to the source region of a PTFET.) In a particular embodiment, $In_{0.53}Ga_{0.47}As$ may be used for the third compound semiconductor, i.e., for the drain region of an NTFET, while $GaAs_{0.5}Sb_{0.5}$, and $In_{0.53}Ga_{0.47}As$ may be used, respectively, for the first and second compound semiconductors of the NTFET, i.e., for the source and the channel regions.

Various materials and combinations of materials exhibit the properties discussed above and can be used for embodiments of the invention. Some of these have been mentioned above, and are repeated below. For example, for lattice matched homojunctions, narrow band gap materials with low effective mass such as InAs, $In_xGa_{1-x}As$ (for x≥0.53), InSb, InN, InAsSb, and InGaN may be used, where In is indium, As is arsenic, Ga is gallium, Sb is antimony, and N is nitrogen. For lattice matched and mismatched heterojunctions, possible NTFET materials include $GaAs_{0.5}Sb_{0.5}$ for the source (or, in the language of the preceding paragraph, for the first compound semiconductor), $In_{0.53}Ga_{0.47}As$ (or $In_{0.53}GaAs$) for the channel (or, in the language of the preceding paragraph, for the second compound semiconductor), and $In_xGa_{1-x}As$ (or $In_{0.53}GaAs$) for the drain, for x≥0.53. More generally, source, channel, and drain materials may be respectively, GaSb, InGaAsSb, and InAs, or GaSb, InAs, and InAs. For lattice matched and mismatched heterojunctions with type-II band offsets, $GaAs_{0.5}Sb_{0.5}$, $In_{0.53}GaAs$, and $In_{0.53}GaAs$ may be used, respectively, for source, channel, and drain regions. $GaAs_{0.5}Sb_{0.5}$ and $In_{0.53}Ga_{0.47}As$ layers also have type-II band offsets. In embodiments having a delta layer, as mentioned above, the delta layer can comprise $GaAs_{0.08}Sb_{0.92}$.

It should be noted here that layer thicknesses are not critical where homojunctions are concerned, but for heterojunctions there will be a critical layer thickness limit which must be observed when growing the layer on an underlying lattice-mismatched layer. As known in the art, defects may form in the layer being grown if the critical layer thickness is exceeded.

Impact ionization is caused by the injection of tunneling electrons coming from a p+ source. The tunneling current and the impact ionization are dependent on the gate voltage. With no gate voltage, the electric field in the channel is small. Due to the band offsets given in the above proposed structures, chances of avalanche breakdown may be low in the intrinsic (lightly doped) region (the channel region) of such structures when the electric field in the channel is increased.

Figure 2:
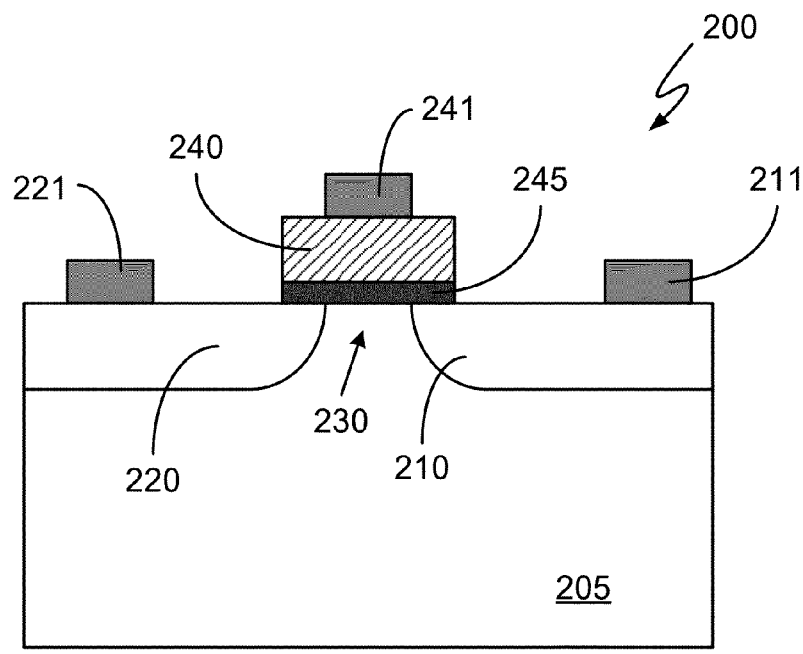
FIG. 2 is a cross-sectional view of a TFET according to another embodiment of the invention.

Other TFET configurations are also possible. For example, the locations of source region 110 and drain region 120 could be switched in TFET 100, such that drain region 120 could be above channel region 130 and source region 110 could be below. Both this and the illustrated embodiment of TFET 100 are examples of a vertical TFET structure (or simply "vertical TFET"), so called because the source, channel, and drain regions are arranged vertically with respect to each other. Also possible are planar (or horizontal) TFETs, in which the source, channel, and drain regions are arranged horizontally with respect to each other. An example of a planar TFET structure is shown in FIG. 2, which is a cross-sectional view of a TFET 200 according to an embodiment of the invention. Each of these alternate TFET configurations may be fabricated such that they share the characteristics and exhibit the advantages that were disclosed above for TFET 100.

It has been shown that the barrier height at a tunneling junction may be reduced by the introduction of a smaller band gap compound semiconductor (e.g., SiGe) at the source end in an otherwise homojunction Si TFET. Low band gap materials such as InAs, InAsSb and InSb have effective masses ($m^*$) and band gap energies ($E_g$) that are much smaller than those of silicon and thus enable tunneling current that is expected to be much larger than that possible with silicon.

As illustrated in FIG. 2, TFET 200 comprises a substrate 205, a source region 210 and a drain region 220 in substrate 205, a channel region 230 between source region 210 and drain region 220, and a gate region 240 separated from substrate 205 by a gate insulator 245. Source region 110, drain region 120, and gate region 140 are contacted, respectively, by a source contact 211, a drain contact 221, and a gate contact 241. If substrate 205 is lightly n-doped, source region 210 is p-doped, and drain region 220 is n-doped, TFET 200 becomes an NTFET. If instead drain region 220 is n-doped and source region 210 is p-doped, TFET 200 becomes a PTFET. In that case, source region 110 and drain region 120 may sit within a p-well (not shown) in substrate 205. In both cases the tunneling junction is located at the end of the channel region nearest the source region.

Figure 3:
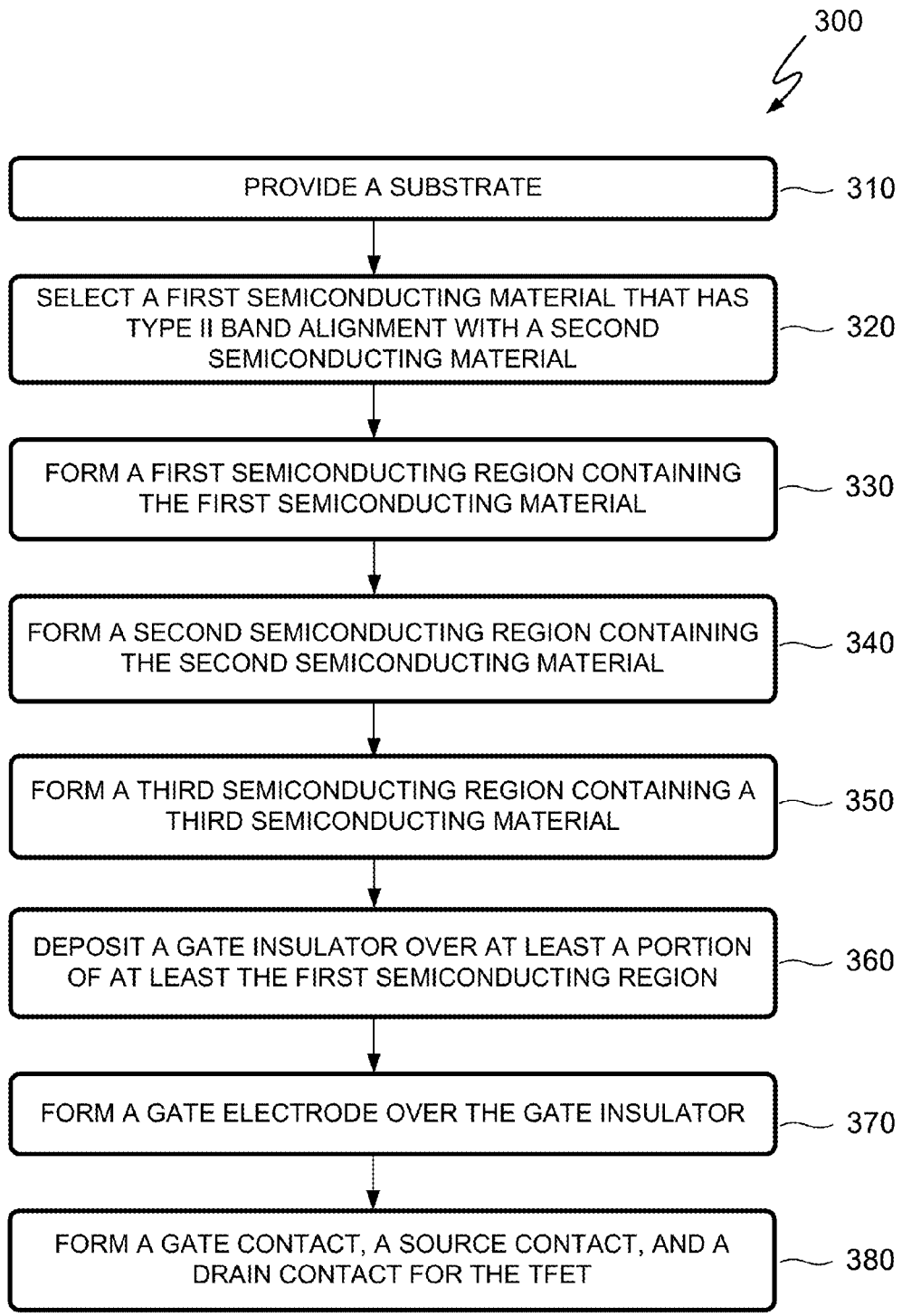
FIG. 3 is a flowchart illustrating a method of manufacturing a TFET according to an embodiment of the invention.

FIG. 3 is a flowchart illustrating a method 300 of manufacturing a TFET according to an embodiment of the invention. As an example, method 300 may result in the formation of a TFET that is similar to TFET 100 or to TFET 200 that are shown, respectively, in FIGS. 1 and 2. Many of the steps in method 300 may be accomplished according to techniques that are well known in the art. Where this is the case, the details of such techniques are not described in detail (or at all).

A step 310 of method 300 is to provide a substrate. As an example, the substrate can be similar to substrate 205 that is shown in FIG. 2.

A step 320 of method 300 is to select a first semiconducting material that has type-II band alignment with a second semiconducting material. In one embodiment, the first semiconducting material comprises a first Group III material and a first Group V material. In a particular embodiment, the first semiconducting material comprises $GaAs_{0.5}Sb_{0.5}$.

A step 330 of method 300 is to form a first semiconducting region containing the first semiconducting material. As an example, the first semiconducting region can be similar to source region 110 or to source region 210 that are shown, respectively, in FIGS. 1 and 2.

A step 340 of method 300 is to form a second semiconducting region containing the second semiconducting material. As an example, the second semiconducting region can be similar to channel region 130 or to channel region 230 that are shown, respectively, in FIGS. 1 and 2. In one embodiment, the second semiconducting material comprises a second Group III material and a second Group V material. The second Group III material can be the same as or different from the first Group III material. Similarly, the second Group V material can be the same as or different from the first Group V material. In one embodiment, step 330, step 340, or another step comprises lattice matching the first compound semiconductor and the second compound semiconductor to each other. In a particular embodiment, the second semiconducting material comprises $In_{0.53}Ga_{0.47}As$.

A step 350 of method 300 is to form a third semiconducting region containing a third semiconducting material. As an example, the third semiconducting region can be similar to drain region 120 or to drain region 220 that are shown, respectively, in FIGS. 1 and 2. In one embodiment, the third semiconducting material comprises a third Group III material and a third Group V material. The third Group III material can be the same as or different from the second and/or the first Group III material. Similarly, the third Group V material can be the same as or different from the second and/or the first Group V material. In one embodiment, step 350 comprises selecting as the third semiconducting material a semiconducting material that has a charge neutrality level lying above a bottom of its conduction band. In a particular embodiment, the third semiconducting material comprises $In_{0.53}Ga_{0.47}As$.

A step 360 of method 300 is to deposit a gate insulator over at least a portion of at least the first semiconducting region. As an example, the gate insulator can be similar to gate insulator 145 or to gate insulator 245 that are shown, respectively, in FIGS. 1 and 2.

A step 370 of method 300 is to form a gate electrode over the gate insulator. As an example, the gate electrode can be similar to gate region 140 or to gate region 240 that are shown, respectively, in FIGS. 1 and 2.

A step 380 of method 300 is to form a gate contact, a source contact, and a drain contact for the TFET.

Figure 4:
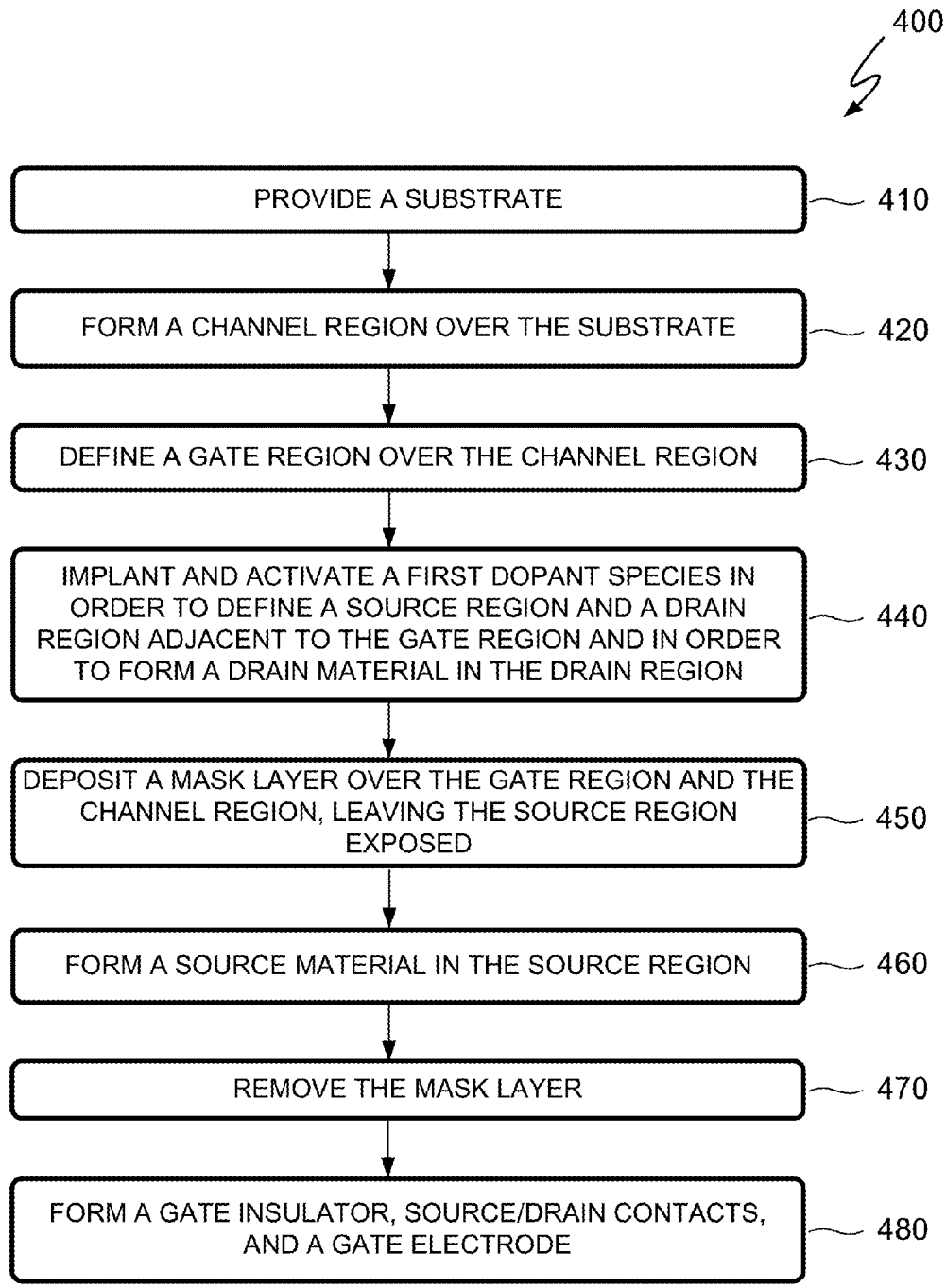
FIG. 4 is a flowchart illustrating a method of manufacturing a planar TFET according to an embodiment of the invention.

FIG. 4 is a flowchart illustrating a method 400 of manufacturing a planar TFET according to an embodiment of the invention. As an example, method 400 may result in the formation of a TFET that is similar to TFET 200 that is shown in FIG. 2. Method 400 may also result in the formation of a TFET 500 as described below and as illustrated in FIGS. 5-8, which are cross-sectional views of TFET 500 at various stages of its manufacturing process according to an embodiment of the invention. Many of the steps in method 400 may be accomplished according to techniques that are well known in the art. Where this is the case, the details of such techniques are not described in detail (or at all). Planar TFET designs may be used to separate out source/gate or drain overlap capacitance that may be a characteristic of vertical TFET designs.

A step 410 of method 400 is to provide a substrate. As an example, the substrate can be similar to substrate 205 that is shown in FIG. 2.

A step 420 of method 400 is to form a channel region over the substrate. As an example, the channel region can be similar to channel region 230 that is shown in FIG. 2. As another example, the channel region can be similar to a channel region 530 that is first shown in FIG. 5. In one embodiment, step 420 comprises selecting a first semiconducting material to occupy the channel region, where the first semiconducting material has type-II band alignment with a second semiconducting material to be introduced below in step 460. In a particular embodiment, step 420 comprises growing $In_{0.53}Ga_{0.47}As$.

A step 430 of method 400 is to define a gate region over the channel region. As an example, the gate region can be similar to gate region 240 that is shown in FIG. 2. As another example, the gate region can be similar to a gate region 540 that is first shown in FIG. 5. In one embodiment, step 430 comprises depositing (and later removing) a high-k or other gate insulator (such as a gate insulator 545 as first shown in FIG. 5) and a gate metal (such as a gate metal 546 as first shown in FIG. 5) and patterning them in order to define a sacrificial gate.

Figure 5:
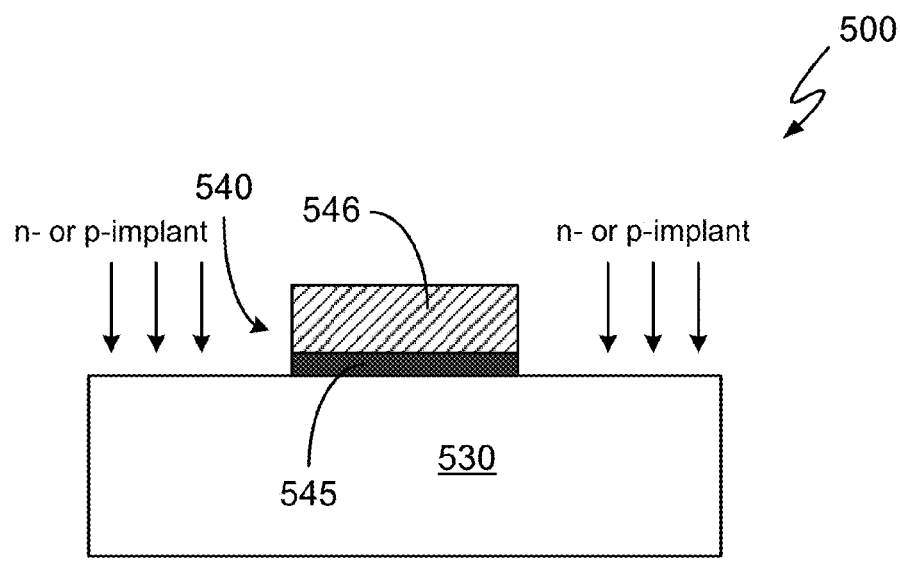
FIGS. 5-8 are cross-sectional views of a planar TFET at various stages of its manufacturing process according to an embodiment of the invention.

A step 440 of method 400 is to implant and activate a first dopant species in order to define a source region and a drain region adjacent to the gate region and in order to form a drain material in the drain region. The source region and the channel region form a tunneling junction of the planar TFET along their adjacent sides. The first dopant species may be activated by an annealing process according to techniques known in the art, either as part of step 440 or at a different stage of method 400, perhaps following step 450 (as mentioned below). As an example, the source region and the drain region can be similar to, respectively, source regions 110 and 210 and drain regions 120 and 220, all of which are shown in FIG. 1 or 2. The implant of step 440 is depicted in FIG. 5 with arrows representing an n-type or a p-type implant event. In one embodiment, step 440 comprises implanting the source region and the drain region with the doping species (e.g., n+) and then later etching out the source region to leave it open for a subsequent p+ implantation. Amorphized InGaAs, for example, etches selectively compared to an epitaxial film so it may be helpful to this process if the source region is amorphized by a high energy ion implantation prior to etching.

Figure 6:
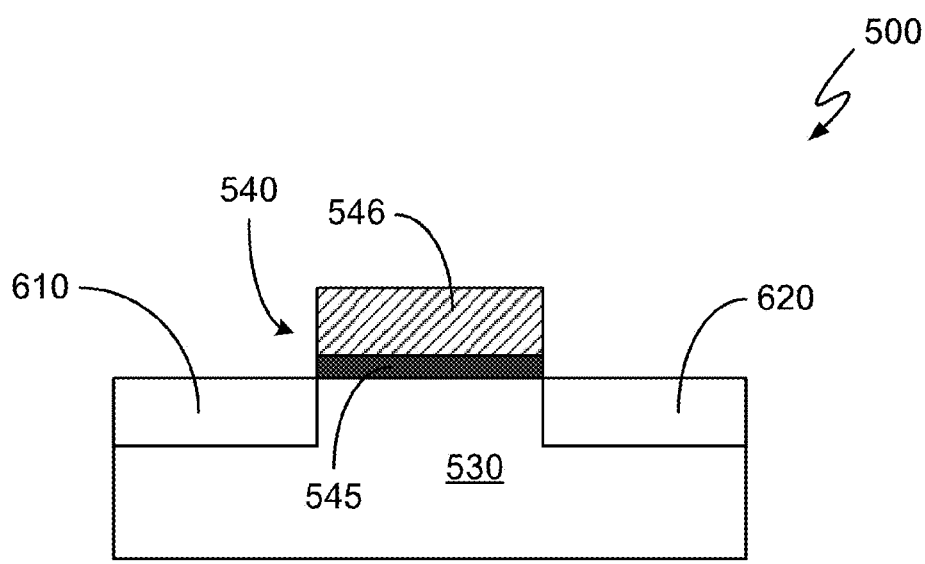

In various embodiments, as mentioned above, the channel region and the drain region contain the same semiconducting material, so that where the channel region may contain, for example, undoped or lightly doped $In_{0.53}Ga_{0.47}As$, the drain region, following step 440, may contain more highly-doped $In_{0.53}Ga_{0.47}As$. FIG. 6 illustrates a result of step 440 according to one embodiment of the invention. As an example, the source region defined by step 440 can be similar to a source region 610, shown in FIG. 6, and the drain region defined by step 440 can be similar to a drain region 620, also shown in FIG. 6.

Figure 7:
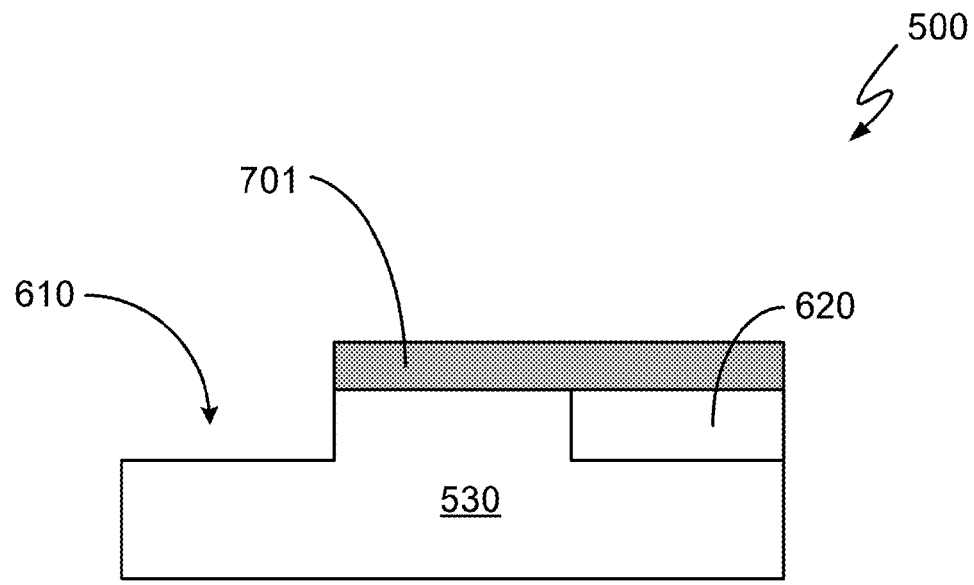

A step 450 of method 400 is to deposit a mask layer over the gate region and the channel region, leaving the source region exposed. As an example, the mask layer can be similar to a mask layer 701 that is shown in FIG. 7. In one embodiment, mask layer 701 can comprise silicon nitride (SiN). In one embodiment, step 450 can be preceded by the removal of the sacrificial gate and followed by an implant activation anneal of the doped regions. In FIG. 7, for example, the implanted material has been removed from source region 610, and mask layer 701 does not extend over source region 610.

A step 460 of method 400 is to form a source material in the source region. In one embodiment, step 460 comprises forming in the source region a second semiconducting material that has type-II band alignment with the first semiconducting material (introduced above in step 420). In a particular embodiment, step 460 comprises growing $GaAs_{0.5}Sb_{0.5}$. As an example, step 460 can comprise the in-situ re-growth of a few nm of the first semiconducting material (e.g., InGaAs) followed by the re-growth of a source material such as in-situ p-doped GaAsSb. The source material will not grow on regions covered by the mask layer.

Figure 8:
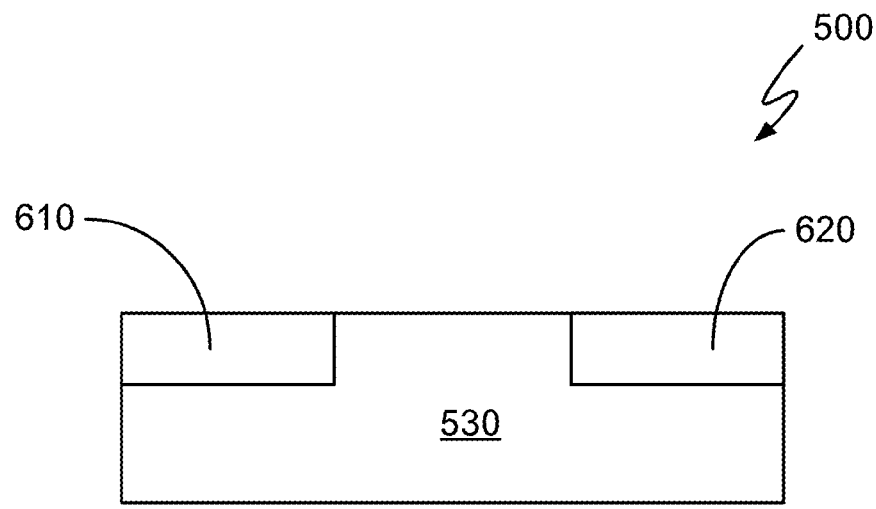

A step 470 of method 400 is to remove the mask layer. FIG. 8 depicts TFET 500 following the performance of step 470 according to an embodiment of the invention.

A step 480 of method 400 is to form a gate insulator, source/drain contacts, and a gate electrode. As an example, the gate insulator, the source/drain contacts, and the gate electrode can be similar to, respectively, gate insulators 145 and/or 245, source contacts/drain contacts 111, 211/121, 221, and gate regions 140 and/or 240, all of which are shown in FIG. 1 or 2. The performance of step 480 and other processing steps may result in a TFET that resembles TFET 200, shown in FIG. 2.

Method 400 is one method of constructing a planar TFET according to embodiments of the invention. Many other methods and variations are, of course, also possible. One of these additional methods will now be described. Device fabrication may begin with the growth of undoped (or lightly doped) InGaAs on buffer layers/substrate in a reactor. Lattice-matched p-type GaAsSb (lattice matched to InGaAs as well as InP) is then deposited in the reactor. Once the GaAsSb layer is grown, the wafer is removed from the vacuum chamber and a SiN mask is deposited. A source mesa is formed by conventional lithography, with etching performed up to somewhere in the bulk of undoped InGaAs. The wafer is then sent to the reactor and re-growth of undoped InGaAs follows. There is no growth of InGaAs on the SiN layer. After a few nm of InGaAs, n+ $In_xGa_{1-x}As$ (x=0.53) or strained $In_xGa_{1-x}As$ (x>0.53) drain is deposited. The rest of the device fabrication is carried out to deposit gate oxide, S/D and gate.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the TFETs and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:
1. A tunnel field effect transistor comprising:
 a source region;
 a drain region;

a channel region between the source region and the drain region; and a gate region adjacent to the channel region,
wherein:
the source region contains a first compound semiconductor comprising $GaAs_{0.5}Sb_{0.5}$; and
the channel region contains a second compound semiconductor comprising $In_{0.53}Ga_{0.47}As$.

2. The tunnel field effect transistor of claim 1 wherein:
the drain region contains a material having a charge neutrality level that lies above a bottom of its conduction band.

3. The tunnel field effect transistor of claim 1 wherein:
the drain region comprises a third compound semiconductor; and
the third compound semiconductor is $In_{0.53}Ga_{0.47}As$.

4. The tunnel field effect transistor of claim 1 further comprising:
a delta layer between the source region and the channel region.

5. The tunnel field effect transistor of claim 4 wherein:
the delta layer is located at a junction of the source region and the channel region;
the junction is a tunneling junction of the tunnel field effect transistor; and
the delta layer comprises a material that lowers at least one of a valence band offset and a band gap at the tunneling junction.

6. The tunnel field effect transistor of claim 5 wherein:
the delta layer comprises $GaAs_{0.08}Sb_{0.92}$.

7. The tunnel field effect transistor of claim 6 wherein:
the delta layer is fully strained.

8. A tunnel field effect transistor comprising:
a source region;
a drain region;
a channel region between the source region and the drain region; and
a gate region adjacent to the channel region,
wherein:
the source region contains a first compound semiconductor comprising a first Group III material and a first Group V material;
the channel region contains a second compound semiconductor comprising a second Group III material and a second Group V material; and
the drain region contains a material having a charge neutrality level that lies above a bottom of its conduction band.

9. The tunnel field effect transistor of claim 8 wherein:
the second compound semiconductor has type-II band alignment with the first compound semiconductor.

10. The tunnel field effect transistor of claim 8 wherein:
the first compound semiconductor and the second compound semiconductor are lattice matched to each other.

11. The tunnel field effect transistor of claim 8 wherein:
the drain region comprises a third compound semiconductor; and
the third compound semiconductor is $In_{0.53}Ga_{0.47}As$.

12. The tunnel field effect transistor of claim 8 further comprising:
a delta layer between the source region and the channel region.

13. The tunnel field effect transistor of claim 12 wherein:
the delta layer is located at a junction of the source region and the channel region;
the junction is a tunneling junction of the tunnel field effect transistor; and
the delta layer comprises a material that lowers at least one of a valence band offset and a band gap at the tunneling junction.

14. The tunnel field effect transistor of claim 13 wherein:
the delta layer comprises $GaAs_{0.08}Sb_{0.92}$; and
the delta layer is fully strained.

15. A tunnel field effect transistor comprising:
a source region;
a drain region;
a channel region between the source region and the drain region; and
a gate region adjacent to the channel region,
wherein:
the source region contains a first compound semiconductor comprising a first Group III material and a first Group V material;
the channel region contains a second compound semiconductor comprising a second Group III material and a second Group V material; and
the first compound semiconductor and the second compound semiconductor are lattice matched to each other.

16. The tunnel field effect transistor of claim 15 wherein:
the second compound semiconductor has type-II band alignment with the first compound semiconductor.

17. The tunnel field effect transistor of claim 15 wherein:
the drain region contains a material having a charge neutrality level that lies above a bottom of its conduction band.

18. The tunnel field effect transistor of claim 15 wherein:
the drain region comprises a third compound semiconductor; and
the third compound semiconductor is $In_{0.53}Ga_{0.47}As$.

19. The tunnel field effect transistor of claim 15 further comprising:
a delta layer between the source region and the channel region,
wherein:
the delta layer is located at a junction of the source region and the channel region;
the junction is a tunneling junction of the tunnel field effect transistor; and
the delta layer comprises a material that lowers at least one of a valence band offset and a band gap at the tunneling junction.

20. The tunnel field effect transistor of claim 19 wherein:
the delta layer comprises $GaAs_{0.08}Sb_{0.92}$; and
the delta layer is fully strained.

* * * * *